United States Patent [19]

Dawson et al.

[11] Patent Number: 6,054,356
[45] Date of Patent: *Apr. 25, 2000

[54] TRANSISTOR AND PROCESS OF MAKING A TRANSISTOR HAVING AN IMPROVED LDD MASKING MATERIAL

[75] Inventors: Robert Dawson, Austin; Mark W. Michael, Cedar Park; Fred N. Hause, Austin, all of Tex.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/761,332

[22] Filed: Dec. 10, 1996

[51] Int. Cl.[7] .................................................. H01L 21/336
[52] U.S. Cl. ........................ 438/301; 438/303; 438/305; 438/624; 438/780
[58] Field of Search ..................... 438/301, 305, 438/303, 780, 624, 231, 153; 257/336, 344, 408, 900, 586, 594

[56] References Cited

U.S. PATENT DOCUMENTS

| | | | |
|---|---|---|---|
| 4,068,019 | 1/1978 | Boeckl | 438/780 |
| 4,532,697 | 8/1985 | Ko | 438/305 |
| 4,603,472 | 8/1986 | Schwabe et al. | 438/303 |
| 4,728,617 | 3/1988 | Woo et al. | 438/305 |
| 4,755,479 | 7/1988 | Miura | 438/303 |
| 5,234,852 | 8/1993 | Liou | 438/303 |
| 5,281,552 | 1/1994 | King et al. | 438/301 |
| 5,428,240 | 6/1995 | Lur | 257/389 |
| 5,478,776 | 12/1995 | Luftman et al. | 438/301 |
| 5,482,876 | 1/1996 | Hsieh et al. | 438/303 |
| 5,548,149 | 8/1996 | Joyner | 257/347 |
| 5,569,624 | 10/1996 | Weiner | 438/301 |
| 5,585,658 | 12/1996 | Mukai et al. | 257/344 |
| 5,599,734 | 2/1997 | Byun et al. | 438/301 |
| 5,849,615 | 12/1998 | Ahmad et al. | 438/231 |

*Primary Examiner*—Carl Whitehead, Jr.
*Assistant Examiner*—Khanh Duong
*Attorney, Agent, or Firm*—Kevin L. Daffer; Conley, Rose & Tayon

[57] ABSTRACT

A transistor is provided with a gradually increasing source and drain arsenic doping profile in a lateral direction from the gate conductor sidewall surfaces. The very smooth doping profile ensures small electric fields at the channel-drain interface for the benefit of reducing hot-carrier effects. Such a doping profile may be achieved by performing the ion implantation through a non-conformal layer of spin-on glass. By controlling the viscosity of the SOG and its deposition speed, different meniscus shapes may be formed. The doping profile of the arsenic in the source and drain regions follows the profile of the upper surface of the SOG. Arsenic is advantageously used for both the lightly doped and heavily doped regions of the source/drain junctions. Arsenic has lower mobility compared to phosphorus and is better at maintaining its original doping profile in heating of the device during further processing. Too much alteration in the original doping profile over time may change the device characteristics beyond acceptable levels.

21 Claims, 3 Drawing Sheets

TRANSISTOR AND PROCESS OF MAKING A TRANSISTOR HAVING AN IMPROVED LDD MASKING MATERIAL

BACKGROUND OF THE INVENTION

1. Field of the Invention

This invention relates to the field of semiconductor processing and, more particularly, to a transistor with an improved lightly doped drain ("LDD") structure and fabrication method for forming such a transistor.

2. Description of Relevant Art

Fabrication of a transistor is well-known. The manufacturing process begins by lightly doping a single crystal silicon substrate n-type or p-type. The specific area where the transistor will be formed is then isolated from other areas on the substrate with the use of isolation structures. In modern fabrication laboratories, the isolation structures may comprise shallow trenches in the substrate filled with dielectric oxide which acts as an insulator. Isolation structures may alternatively comprise, for example, locally oxidized silicon ("LOCOS") structures well known in the art. A gate dielectric may be formed by thermal oxidation of the silicon substrate; this oxidation might be performed in a thermal oxidation furnace or, alternatively, in a rapid thermal anneal ("RTA") apparatus. A gate conductor is then formed by depositing polycrystalline silicon upon the semiconductor topography and then doping it with an ion implant or a diffusion process. The gate structure is patterned using a mask followed by exposure, development, and etching. Subsequently, source and drain regions are doped, via ion implantation, with a high dosage n-type or p-type dopant. A channel region between the source and the drain is protected from the implant species by the pre-existing gate structure. When voltage above a certain threshold is applied to the gate of an enhancement-mode transistor, the channel between the source and drain becomes conductive and the transistor turns on.

As device dimensions are reduced while supply voltages remain constant (or are not reduced as rapidly as the structures are scaled), the maximum electric field becomes localized near the drain side of the channel causing acceleration of charge carriers toward the overlying gate oxide. The carriers become trapped in the gate oxide, a phenomenon generally called hot-carrier injection. The most harmful of its effects is damage inflicted to the gate dielectric and/or the substrate/gate dielectric interface. Over time, operational characteristics of the device may degrade due to hot-carried effects, that degradation resulting in, e.g., improper variation of threshold voltage, linear region transconductance, subthreshold slope, and saturation current. This may lead to the reduction of the lifetime of the devices. As a result, several techniques have been developed to combat this problem.

One set of methods involves making the gate dielectric and/or the gate substrate/dielectric interface more resistant to hot carriers. This can be accomplished by developing dielectric films that exhibit very low-density oxide trapping centers, interface state traps, and fixed oxide charge through special processing techniques. Reducing charge trapping opportunities, however, has given way to simply reducing the maximum electric field instead. Reducing the electric field in the drain-side channel or, more specifically, the maximum electric field is certainly a popular way to control hot-carrier effects. Reducing the electric field can be achieved by reducing the supply voltage of the device. However, this is not always possible due to operation voltage compatibility and other design reasons like noise levels. A common approach is to reduce the abruptness in voltage changes at the reverse-biased p-n junction at or near the drain side of the transistor channel. Disbursing abrupt voltage changes reduces the overall maximum electric field strength and the harmful hot-carrier effects resulting therefrom.

Reducing abrupt voltage changes can be accomplished by replacing an abrupt drain doping profile with a more gradually increasing lateral doping profile. A more gradual doping profile distributes the maximum electric field along a larger lateral distance such that the supply voltage is shared by the channel and the drain. Absent a more gradual doping profile, an abrupt junction can exist where almost all of the voltage drop occurs across the lightly-doped channel.

The simplest method to obtain a gradual doping at the drain-side channel is to use a dopant with a high diffusivity, for example, phosphorus instead of arsenic for an n-channel device. The faster-diffusing phosphorus readily migrates from its implant position in the drain toward the channel creating a gradually doped drain and consequently a smoother voltage profile. Unfortunately, however, the high diffusivity of phosphorus, in addition to creating a gradual lateral doping profile, also increases the lateral and vertical extents of the source and drain. Enlarging the source/drain junctions may bring about harmful short-channel effects and/or parasitic capacitances. Short-channel effects may result in less well-predicted threshold voltage, larger subthreshold currents, and altered IV characteristics.

For alleviating the hot carrier problem in short-channel transistors, a combination of phosphorus and arsenic may be used to form a double-diffused drain ("DDD"). Phosphorus and arsenic are co-implanted into the source and drain regions using two separate species: a medium dose of phosphorus ($10^{14}$–$10^{15}$ ions/cm$^{-2}$); and a heavy dose of arsenic (2–5×$10^{15}$ ions/cm$^{-2}$) may be used, for example. The faster-diffusing phosphorus naturally diffuses more than arsenic creating a less abrupt doping grading. Again such a doping grading reduces voltage abruptness that reduces the electric field in the channel region. The DDD structure is attractive because it adds little complexity to the process sequence. No extra masking steps are required; both dopants are implanted in sequence. Selecting the correct process and device parameters that yield an optimum DDD device, however, involves significant process and device calibration. Too much phosphorus will yield punchthrough problems, while not enough phosphorus will not provide adequate protection against hot-carrier effects.

The most widely-used device structure for increasing hot-carrier reliability is the lightly-doped drain ("LDD"). An LDD structure is made by a two-step implant process. The first step takes place after the formation of the gate. For an n-channel device, a relatively light implant of phosphorus or arsenic is used to form the lightly doped region adjacent the channel (i.e., the LDD implant). A conformal CVD oxide film is then deposited over the LDD implant and interposed gate. The oxide is then removed using an anisotropic dry-etch process. Anisotropic etch removes oxide in the substantially horizontal regions, leaving what are known as "spacers" on the sides of the gate. After the oxide spacers are formed, a second implant occurs at a higher dosage than the first implant. The second implant is chosen to use the same implant "type" (i.e., n or p) as the first. It is masked from areas adjacent the gate by virtue of the pre-existing oxide spacers. Using an n-type example, the first implant may use phosphorus, while the second uses arsenic. The oxide spacers serve to mask the high dose arsenic and to offset it from the gate edges. By introducing the spacers after the LDD implant, the LDD structure offers more freedom in optimizing the LDD implant area than the DDD structure. The LDD area is controlled by the lateral spacer dimension and the thermal drive cycle, and is made independent from the source and drain implant (second implant) depth. The conventional LDD process, however, sacrifices some device performance to improve hot-carrier resistance. For example, the LDD process exhibits reduced drive current under comparable gate and source voltages.

LDD structures are well versed at reducing the abruptness of voltage across the reversed-biased drain-channel junction. Still, however, the doping profile in this critical area near the drain is not necessarily a smooth one. In addition, conventional LDD structures in n-channel devices typically use phosphorus which has a high diffusivity. Any subsequent thermal processing will cause the phosphorus atoms to migrate laterally into the channel or vertically into the substrate. As mentioned above, migration enhances unwanted parasitic problems or short-channel effects. Migration of dopants over time will also alter many transistor characteristics beyond their allowed tolerances. Such alteration will limit device lifetimes significantly.

SUMMARY OF THE INVENTION

The problems outlined above are in large part solved by a transistor and a transistor fabrication method in which the doping profile (for example, arsenic for an n-type dopant) has a concentration density which increases in depth by an amount proportional to the lateral distance from the opposing edges of the gate. This may be obtained by depositing a non-conformal implant displacement layer, for example, spin on glass ("SOG"), which forms an arcuate pattern having a concave shape as viewed from a point above the transistor and extending laterally from the opposing edges of the gate conductor. The layer is deposited over the transistor topography with the gate structure in place. Implantation of the source and drain species is then performed through the SOG. Implantation through the SOG results in a very smooth dopant distribution in the source and drain regions that combats hot carrier problems more effectively than other techniques currently used in the industry. Furthermore, the proposed topological features and processing steps hereof do not depend on the use of phosphorus as an implant species to obtain smooth doping profiles. Arsenic may be used which has a much lower diffusivity than phosphorus and does not alter its profile over time or with subsequent processing heat cycles. Moreover, fewer steps are required for the manufacturing of the proposed device compared to a typical LDD structure. The additional step of depositing a conformal oxide and then anisotropically removing it to form oxide spacers on the opposing sides of the gate conductor is no longer needed.

In a first embodiment, the present invention contemplates a transistor in which a non-conformal spin-on dielectric is deposited across a silicon substrate and a patterned gate conductor. The spin-on dielectric may be, for example, SOG. The SOG consists of either siloxanes or silicates mixed in alcohol-based solvents. The dielectric is therefore preferably deposited in liquid form and thereafter hardened by a cure process. After cure, the dielectric's upper surface extends in an arcuate pattern laterally from the opposing edges of the gate conductor. The arcuate upper surface is used to mask by varying amounts dopants sent into and partially through the dielectric. What goes through the dielectric forms what is called a doping profile. The doping profile within the substrate adjacent the gate edge has a concentration density that increases both in magnitude and in depth by an amount proportional to the lateral distance from the gate edge.

In a second embodiment, the present invention contemplates a transistor as in the first embodiment with an additional source and drain implant. A second species implantation takes place after oxide spacers have been formed on the opposing sides of the gate conductor. The second implant, which is also arsenic, is of higher dosage and is preferably implanted deeper into the source/drain junction areas. The second implant may be needed to further enhance the transistor's performance.

The present invention further contemplates a process for forming a transistor. A semiconductor substrate is provided. The substrate is coated with a dielectric oxide and a conductive gate structure is patterned upon the oxide-covered substrate. Following this, SOG, consisting of siloxanes and silicates mixed in alcohol based solvents, is deposited over of the transistor topography. A non-conformal layer of the SOG is formed after heat treatment, with the upper surface of the SOG forming a meniscus extending laterally from the opposing vertical edges of the gate conductor. By choosing SOG of different viscosities and by spin-depositing at different rotational velocities, differing meniscus profiles may be obtained. Once the proper meniscus profile is established, arsenic is then implanted through the SOG and into the source/drain junctions. The doping profile of the arsenic implant follows the shape of the SOG meniscus. By varying the implantation dosage and energy, further control of the doping profile in the source and drain regions may be achieved.

If additional doping of the source and drain regions is deemed necessary, a second implant species of higher dosage is used. The additional doping takes place by removing the SOG and then depositing a conformal oxide over the semiconductor topography. The conformal oxide layer is subsequently removed using an anisotropic etch process. An anisotropic etch process leaves oxide spacers on the opposing vertical sides of the gate structure. The second implantation is now performed. Due to the oxide spacers, the second doping profile is laterally offset from the opposing vertical sides of the gate structure.

BRIEF DESCRIPTION OF THE DRAWINGS

Other objects and advantages of the invention will become apparent upon reading the following detailed description and upon reference to the accompanying drawings in which.

Figure 1:
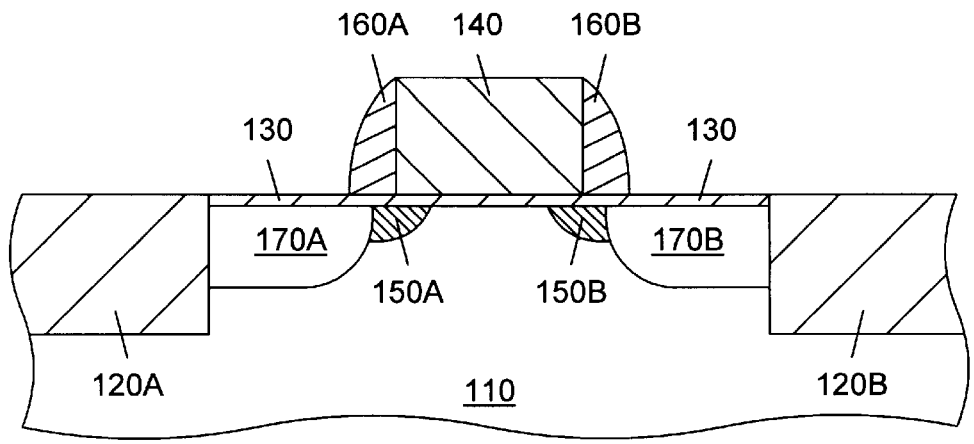
FIG. 1 is a partial cross-sectional view of a transistor with a conventional LDD structure shown at the source/drain junctions thereof.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 1 is used to describe a conventionally formed transistor. It depicts an LDD structure used in the industry to combat hot-carrier effects. Semiconductor substrate 110 is shown laterally displaced between first isolation structure 120A and second isolation structure 120B. Isolation structures 120 are shown here as shallow trenches, but they may alternatively comprise, for example, LOCOS structures. Gate dielectric layer 130 is preferably achieved by a thermal oxidation process such that it comprises silicon dioxide or silicon oxynitride. A layer of polycrystalline silicon ("polysilicon"), is deposited by CVD over the wafer topography. The gate structure 140 is then patterned from the deposited polysilicon layer using well-known lithography techniques. Following exposure and development, the polysilicon is etched to form the gate conductor. Subsequently a light dosage of phosphorus is implanted into the source and drain regions 150A and 150B. Oxide spacers 160A and 160B are then formed on the sides of the gate structure by depositing a layer of conformal oxide on the transistor and then etching it using an anisotropic etch process. A second species (arsenic) of higher dosage is implanted into the source and drain regions to form a second doping profile 170A and 170B. Transistors without the lightly doped phosphorus region experience a relatively abrupt voltage change at the channel-drain interface. Abrupt voltage changes give rise to high electric fields; the cause of the hot-carrier effect.

Figure 2:
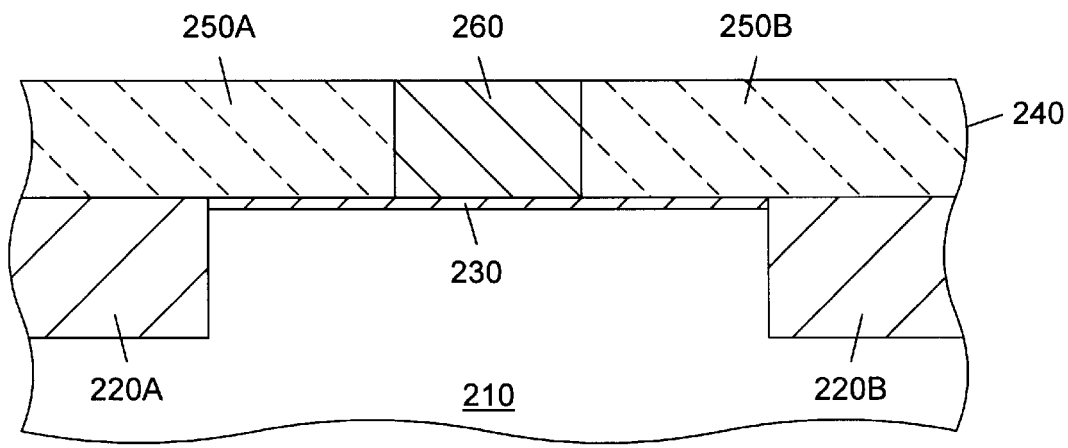
FIG. 2 is a partial cross-sectional view of a semiconductor substrate with isolation structures and a gate conductor structure patterned between the isolation structures according to an initial processing step.

Turning now to FIG. 2, a partial cross-sectional view of a semiconductor topography is shown during the early stages of transistor formation. Semiconductor substrate 210 is shown laterally displaced between first isolation structure 220A and second isolation structure 220B. Semiconductor substrate 210 preferably comprises lightly doped (i.e., with resistivity of approximately 12 $\Omega$-cm) p-type silicon. Isolation structures 220 are shown here as shallow trenches (formed by anisotropically etching a trench, depositing a dielectric such as CVD oxide into the trenched shaped void, and subsequently removing the excess with an etch), but they may alternatively comprise, for example, LOCOS structures. Gate dielectric layer 230 is preferably achieved by a thermal oxidation process such that it comprises silicon dioxide or silicon oxynitride. The formation of gate dielectric layer 230 may be performed in a thermal oxidation furnace using temperatures of approximately 700–900° C. or alternatively in an RTA chamber. The thickness for the gate dielectric 230 is preferably between 15 and 200Å. A layer of polycrystalline silicon ("polysilicon") 240, typically 0.2–0.5 $\mu$m thick, is then deposited by CVD over the whole structure. Either ion implantation or diffusion with phosphorus is then used to dope the polysilicon 240 to a sheet resistance of, for example, 10–400 $\Omega$/sq to correctly set the work function. Subsequent processing may be used to form a metal silicide on the polysilicon surface. It is possible that later implants are adequate to suitably dope the polysilicon. Extra doping from further processing may need to be taken into account when optimizing the polysilicon 240 doping parameters. The gate structure 260 is then patterned using a mask. Following exposure and development, the polysilicon 250 is etched to form the gate conductor.

Figure 3:
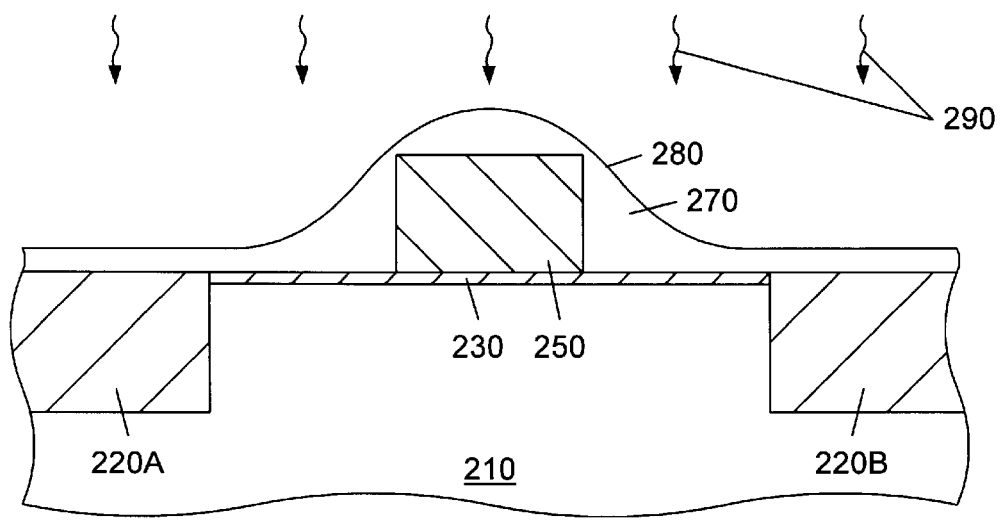
FIG. 3 is a processing step subsequent to FIG. 2 in which a non-conformal layer of SOG is deposited on the source/drain junctions and the gate structure.

Turning now to FIG. 3, a spin-on non-conformal dielectric 270 is deposited on the structure. The dielectric may comprise spin-on glass ("SOG") consisting of siloxanes or silicates mixed in alcohol-based solvents. The SOG's upper surface 280 extends in an arcuate pattern laterally from the opposing edges of the gate conductor. The arcuate pattern has a concave shape as viewed from a point above upper surface 280. By using SOG of different viscosities spun on at different speeds, an upper surface can be obtained with different meniscus shapes. Additional shaping of the meniscus may be done by performing, for example, an etchback on upper surface 280. Heat treatment 290 is applied to the structure to cure the SOG to a hardened state. The SOG is first baked at a low temperature (e.g., 150–250° C. for 1–15 min in air), and then at a higher temperature (e.g., 400–425° C. for 30–60 min in air or nitrogen). The solvent is driven off, and water is evolved from the film.

Figure 4:
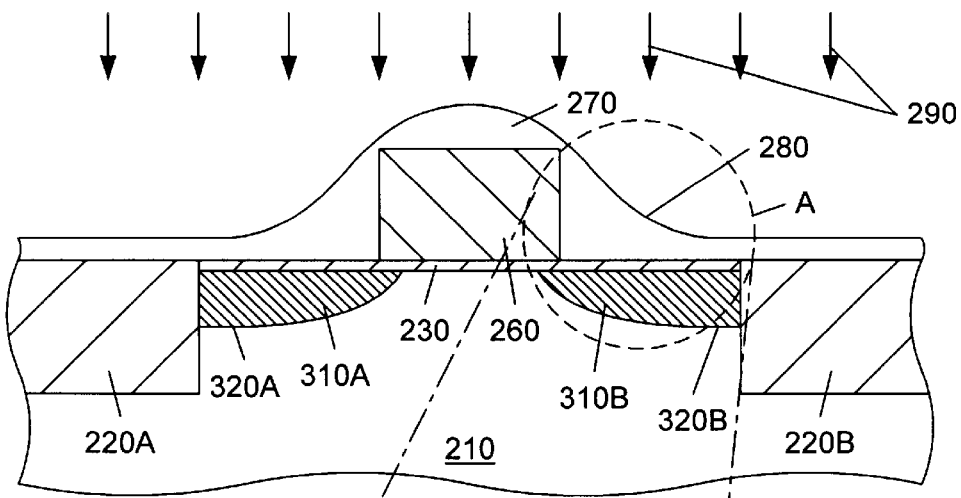
FIG. 4 is a processing step subsequent to FIG. 3 in which the source/drain junctions are doped through the SOG to form a desired doping profile.

Turning to FIG. 4 the source and drain doping is performed. Arsenic 300 is implanted, to a varying degree, through the SOG 270 and into the source and drain regions 310A and 310B. By adjusting the dosage and energy of the arsenic implant 300, someone skilled in the art can control the doping profile of the arsenic in the source and drain regions 310A and 310B. For example, a higher energy implant will penetrate deeper into the source and drain regions, and a higher dosage will result in higher dopant concentration in the regions.

Figure 5:
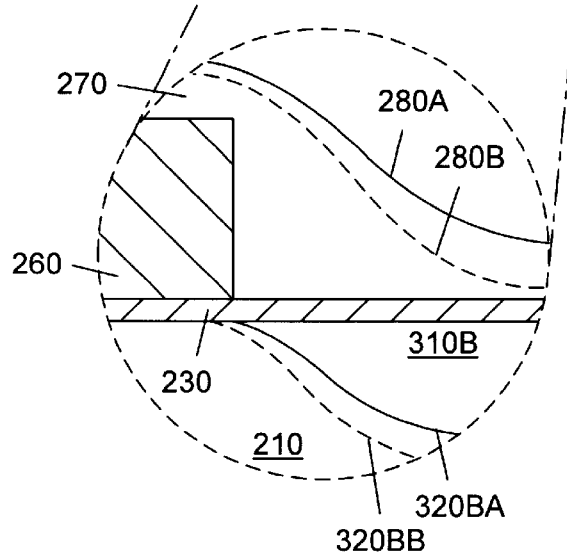
FIG. 5 is a detailed view along plane A of FIG. 4 illustrating a desired meniscus surface of the SOG, and the effects of the meniscus shape on the resulting doping profile.

FIG. 5 shows an expanded view along plane A of FIG. 4. It shows in detail one of the source/drain regions 310B and the SOG upper surface 280 directly above this region. Two possible shapes are shown for the SOG's upper surface. Upper surface 280A has a higher profile and may be used, for example, for a more shallow arsenic implant profile 320BA into the source/drain region. For the deeper doping profile 320BB, a lower SOG profile 280B may be used, for example.

Figure 6:
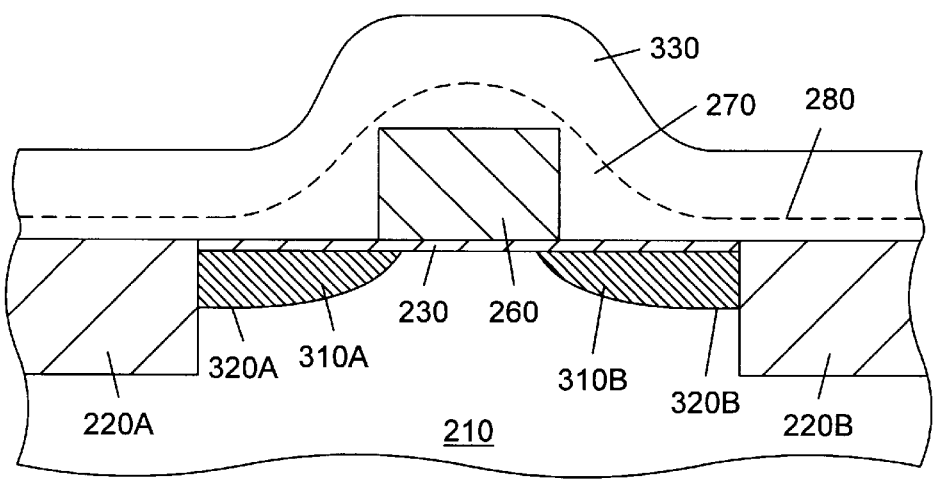
FIG. 6 is a processing step subsequent to FIG. 4 which illustrates the removal of the non-conformal SOG layer and the deposition of a layer of conformal oxide.
Figure 7:
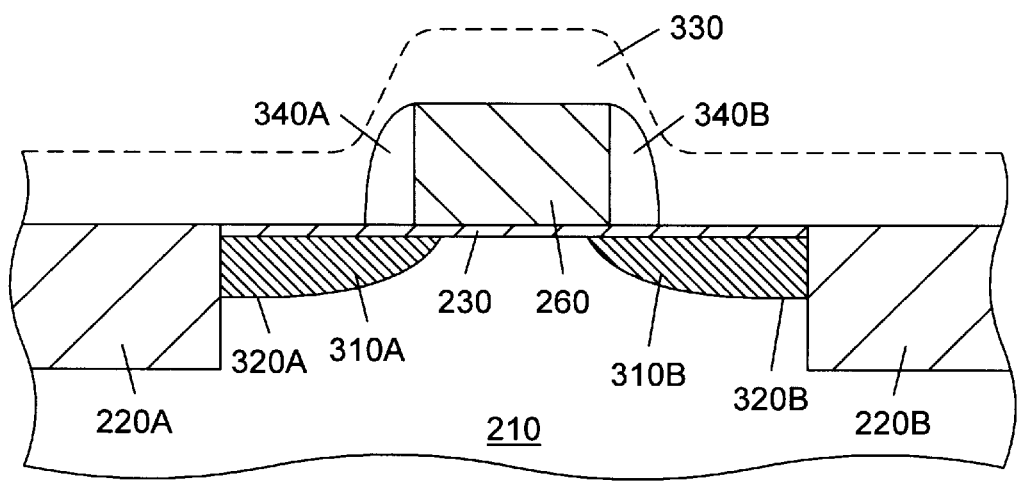
FIG. 7 shows the removal of the oxide layer by an anisotropic etch to form oxide spacers on the vertical sides of the gate.
Figure 8:
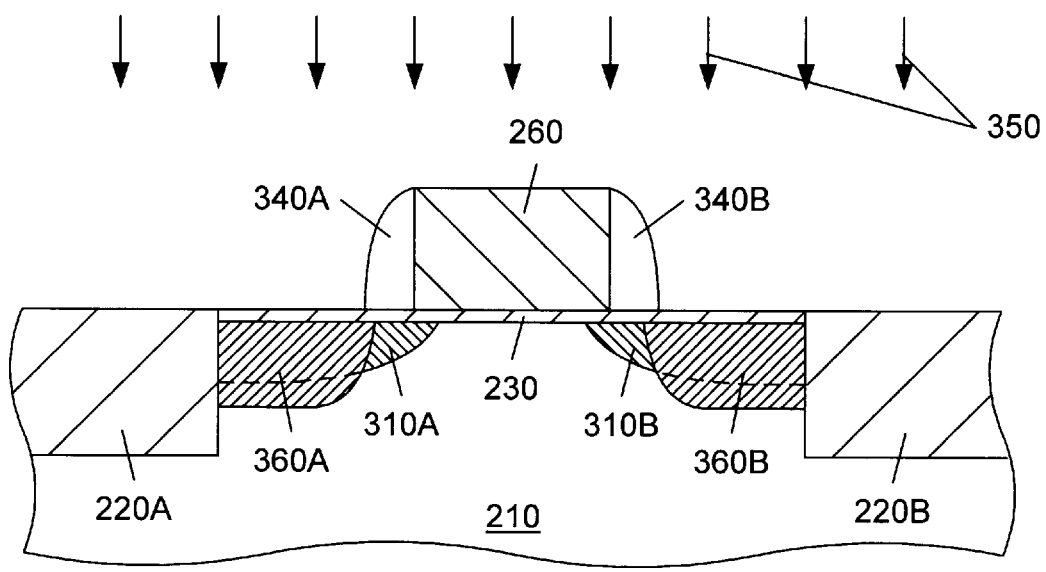
FIG. 8 shows the implantation of a second species into the source and drain regions with the oxide spacers in place.

FIGS. 6, 7, and 8 describe a second embodiment. Referring to FIG. 6, removal of the SOG 270 is shown. A conformal CVD oxide 330 is then deposited on the surfaces removed of SOG 270. A popular method to achieve this deposition is to decompose TEOS at 725° C., as this produces a film with excellent conformality. FIG. 7 shows partial removal of the CVD oxide 330 using an anisotropic dry-etch process. An anisotropic dry-etch process will clear the oxide in the flat areas while leaving spacer structures 340A and 340B on the opposing sidewalls of the gate conductor structure 260. A second implant 350 is now driven into the source and drain regions as shown in FIG. 8. Due to the spacers, the second doping profile 360A and 360B is offset from the opposing sides of the gate conductor. The second implant is of higher energy and dosage compared to the first implant, and consequently penetrates deeper and is of higher concentration. This is an optional processing step and should only be performed if the extra doping concentration is deemed necessary in enhancing the performance of the transistor.

It will be appreciated to those skilled in the art having the benefit of this disclosure that this invention is believed to be capable of producing a transistor with a very smooth source and drain doping profile in order to obtain very low electric fields at the channel-drain interface which better combat the hot-carrier effect. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A process of forming a transistor, comprising:

providing a semiconductor topography;

patterning a gate conductor upon a select region of said semiconductor topography, wherein said gate conductor includes opposed sidewall surfaces which extend substantially perpendicular to said semiconductor topography;

depositing a spin-on material across said gate conductor and said semiconductor topography, wherein portions of said spin-on material are in contact with the opposed sidewall surfaces and an uppermost surface of said gate conductor;

heating said spin-on material to form a spin-on dielectric having a meniscus extending in a lateral direction from said sidewall surfaces, performing a first implant through said spin-on dielectric and into said semiconductor topography to form a source region and a drain region aligned with said sidewall surface wherein a doping profile of said source region and said drain region correspond to an upper surface contour of said meniscus, and wherein an entirety of a dielectric mask through which the first implant is performed consists of the spin-on dielectric.

2. The process as recited in claim 1, wherein patterning said gate conductor comprises:

depositing a layer of polycrystalline silicon upon said semiconductor topography; and removing portions of said polycrystalline silicon from said semiconductor topography.

3. The process as recited in claim 1, wherein depositing said spin-on material comprises adding, in liquid form, spin-on material while said gate conductor and said semiconductor topography are rotating.

4. The process as recited in claim 3, wherein said spin-on material is added at differing viscosities depending upon the desired upper surface contour of said meniscus.

5. The process as recited in claim 3, wherein said gate conductor and said semiconductor topography are rotated at differing velocities depending upon the desired upper surface contour of said meniscus.

6. The process as recited in claim 1, further comprising forming spacers on the opposed sidewall surfaces and further doping the source and drain regions to form a secondary doping profile offset from said gate conductive.

7. The process as recited in claim 1 wherein no etching of said spin-on dielectric or said spin-on material is performed prior to said performing a first implant.

8. A method for forming a transistor, comprising:

forming a gate conductor dielectrically spaced above a semiconductor substrate;

forming a spin-on dielectric across the gate conductor and the semiconductor substrate wherein portions of said spin-on dielectric are in contact with opposed sidewall surfaces and an uppermost surface of said gate conductor;

performing a first implant through the spin-on dielectric and into the semiconductor substrate to form a source and a drain such that an entirety of a dielectric mask through which the first implant is performed consists of the spin-on dielectric.

9. The method as recited in claim 8, wherein said performing a first implant comprises forming source and drain junction depth profiles, wherein each junction depth profile has substantially the same shape as a surface profile of the spin-on dielectric, wherein the surface profile decreases in a concave pattern with increased lateral distance from opposed sidewall surfaces of the gate conductor.

10. The method as recited in claim 8, wherein said forming the spin-on dielectric comprises:

blanket-depositing a spin-on material across the gate conductor and the semiconductor substrate; and heating the spin-on material to a temperature of less than about 500° C., such that volatile components of the spin-on material are removed and a spin-on dielectric is formed.

11. The method as recited in claim 10, wherein said blanket-depositing the spin-on material comprises applying a spin-on liquid while rotating the semiconductor substrate.

12. The method as recited in claim 11, wherein said applying the spin-on liquid comprises applying a mixture comprising a siloxane and an alcohol-based solvent.

13. The method as recited in claim 11, wherein said applying the spin-on liquid comprises applying a mixture comprising a silicate and an alcohol-based solvent.

14. The method as recited in claim 10, wherein said heating the spin-on material comprises a first heating to a temperature between about 150° C. and about 250° C. for a time between about 1 minute and about 15 minutes, and a second heating to a temperature between about 400° C. and about 425° C. for a time between about 30 minutes and about 60 minutes.

15. The method as recited in claim 10, further comprising partially etching the spin-on material, prior to said heating the spin-on material.

16. The method as recited in claim 8, wherein said forming the spin forming a spin-on glass.

17. The method as recited in claim 8, wherein said spin-on dielectric is maintained at a temperature of less than about 500° C. for the duration of the method.

18. The method as recited in claim 8, further comprising partially etching the spin-on dielectric, prior to said implanting.

19. The method as recited in claim 8, wherein said implanting comprises implanting arsenic into a p-type substrate.

20. The method as recited in claim 8, further comprising removing said spin-on dielectric, forming spacers on opposed sidewall surfaces of the gate conductor, and further doping said source and said drain to form a secondary doping profile offset from said gate conductor.

21. The method as recited in claim 8 wherein no etching of said spin-on dielectric or said spin-on material is performed prior to said performing a first implant.

* * * * *

UNITED STATES PATENT AND TRADEMARK OFFICE
CERTIFICATE OF CORRECTION

PATENT NO. : 6,054,356
DATED : April 25, 2000
INVENTOR(S) : Dawson, et. al.

It is certified that error appears in the above-indentified patent and that said Letters Patent is hereby corrected as shown below:

Claim 6, col. 7, line 56, please delete "conductive" and substitute --conductor--.

Claim 16, col. 8, line 46, please delete "spin" and substitute --spin-on dielectric comprises--

Signed and Sealed this

Twentieth Day of March, 2001

*Attest:*

NICHOLAS P. GODICI

*Attesting Officer*     *Acting Director of the United States Patent and Trademark Office*